United States Patent
Bhalla

(10) Patent No.: US 9,093,286 B2
(45) Date of Patent: Jul. 28, 2015

(54) MONOLITHIC IGBT AND DIODE STRUCTURE FOR QUAI-RESONANT CONVERTERS

(71) Applicant: Anup Bhalla, Santa Clara, CA (US)

(72) Inventor: Anup Bhalla, Santa Clara, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 13/954,826

(22) Filed: Jul. 30, 2013

(65) Prior Publication Data
US 2015/0035005 A1    Feb. 5, 2015

Related U.S. Application Data

(62) Division of application No. 12/928,988, filed on Dec. 23, 2010, now Pat. No. 8,502,346.

(51) Int. Cl.
*H01L 29/00* (2006.01)
*H01L 27/06* (2006.01)
*H01L 21/8248* (2006.01)

(52) U.S. Cl.
CPC ........ *H01L 27/0629* (2013.01); *H01L 21/8248* (2013.01)

(58) Field of Classification Search
CPC ............ H01L 21/8224; H01L 21/823487; H01L 21/823821; H01L 21/823885; H01L 27/0237; H01L 27/0652; H01L 29/66348; H01L 29/7397
See application file for complete search history.

(56) References Cited

U.S. PATENT DOCUMENTS

| | | | | |
|---|---|---|---|---|
| 6,404,037 | B1* | 6/2002 | Finney | 257/583 |
| 8,168,999 | B2* | 5/2012 | Tsuzuki et al. | 257/143 |
| 2007/0210386 | A1 | 9/2007 | Mori | |
| 2011/0233714 | A1* | 9/2011 | Lu | 257/493 |
| 2012/0161286 | A1* | 6/2012 | Bhalla | 257/577 |

* cited by examiner

*Primary Examiner* — Colleen A Matthews
*Assistant Examiner* — Quovaunda V Jefferson
(74) *Attorney, Agent, or Firm* — Bo-In Lin

(57) ABSTRACT

This invention discloses a semiconductor power device formed in a semiconductor substrate. The semiconductor power device further includes a channel stop region near a peripheral of the semiconductor substrate wherein the channel stop region further includes a peripheral terminal of a diode corresponding with another terminal of the diode laterally opposite from the peripheral terminal disposed on an active area of the semiconductor power device. In an embodiment of this invention, the semiconductor power device is an insulated gate bipolar transistor (IGBT).

7 Claims, 10 Drawing Sheets

MONOLITHIC IGBT AND DIODE STRUCTURE FOR QUAI-RESONANT CONVERTERS

This is a Divisional application of a previously filed co-pending application with Ser. No. 12/928,988 filed on Aug. 6, 2013 by identical common inventors of this Application. The disclosures made in application Ser. No. 12/928,988 are hereby incorporated by reference in this patent application.

BACKGROUND OF THE INVENTION

1. Field of the Invention

The invention relates generally to semiconductor power devices. More particularly, this invention relates to new configurations and methods for manufacturing improved quasi-resonant converters by combining an insulated gate bipolar transistor (IGBT) with a lateral diode as a monolithic structure and a packaging configuration without a requirement of co-packaging a separate diode die and without a requirement of specialized wafer backside process.

2. Description of the Prior Art

Conventional technologies to configure and manufacture quasi-resonant converters as power devices still have difficulties and limitations. Specifically, conventional resonant converters, according to an industry standard, typically include an insulated gate bipolar transistor (IGBT) 1 and a co-packaged diode 2, as shown in FIG. 1A. Unlike metal oxide semiconductor field effect transistors (MOSFET), IGBT devices do not have an intrinsic body diode. The P-type collector layer 5 at the bottom of the device prevents a would-be body diode from conducting, as shown in FIG. 1B. The manufacturing costs are increased due to this requirement to assemble and connect two separate dies (IGBT and diode) as a co-packaged assembly. In addition the IGBT must be made smaller in order to accommodate the separate diode die within the same package footprint. This increases the resistance and reduces the current handling capability of the device.

One possible application of a conventional quasi-resonant inverter is for rice cookers that use induction heating. In such an application, soft-recovery is not a required feature for the diode. A high performance diode is not needed—the diode only needs to conduct for a short duration before the IGBT turns on.

A reverse conducting IGBT with a vertical diode formed near the backside of the IGBT die has been provided as shown in FIG. 1C. An N-type implant region 6 in the P-type collector layer 5 allows a P-N junction diode to be formed from the IGBT collector to the emitter, starting from the bottom and meeting the P-type body (or emitter) region 7 at the top of the device. This IGBT with the anti-parallel (reverse-conducting) vertical diode as shown in FIG. 1C requires additional backside processing including forming a mask on the backside for a backside implant. These additional backside processing steps cause the production cost to increase, and are more difficult to carry out. In cases with thin wafer processing, additional backside processing steps with the thinned wafer also increase the risk of wafer damage. Also, with the reverse conducting vertical diode configuration, as shown in FIG. 1C, the device may suffer from snapback during device turn-on.

Therefore, a need still exists to provide new IGBT structure and packaging configuration to resolve the difficulties and limitations now encountered by those of ordinary skill in the art of power device design and manufacture.

SUMMARY OF THE PRESENT INVENTION

It is therefore an aspect of the present invention to provide a new and improved device configuration and manufacturing method for providing a monolithic IGBT combined with a lateral diode structure without requiring a co-packaging of an IGBT die with a separate diode die and without requiring backside processing steps on a wafer to form the anti-parallel diode. The production cost and form factor of the quasi-resonant converter are therefore improved.

It is another aspect of this invention to provide a new and improved device configuration and manufacturing method for providing a monolithic IGBT combined with a lateral diode structure by using a channel stop region of the IGBT device to form a lateral diode such that the IGBT is turned on without a snapback problem.

It is another aspect of this invention to provide a new and improved device configuration and manufacturing method for providing a monolithic IGBT combined with a lateral diode structure formed as a P-i-N diode such that the injection efficiency of both sides of the P-i-N diode can be separately controlled with low Qrr achievable without requiring a conventional lifetime control process (such as electron irradiation (ER), or gold and platinum diffusion to form deep level recombination sites).

It is a further aspect of this invention to provide a new and improved device configuration and manufacturing method for providing a monolithic IGBT combined with a lateral diode structure by using a channel stop region of the IGBT device to form a lateral diode such that a larger IGBT die can be implemented and/or a smaller package size can be employed since no co-packaging of a separate diode die is necessary.

Briefly in a preferred embodiment this invention discloses a vertical semiconductor power device formed in a semiconductor substrate. The vertical semiconductor power device further includes a peripheral terminal of a lateral diode corresponding and a central terminal of the diode laterally opposite from the peripheral terminal disposed on an active area of the semiconductor power device. In a further embodiment, the semiconductor device further includes a channel stop region near a periphery of the semiconductor substrate, wherein the peripheral terminal contacts the semiconductor substrate at the channel stop region. In an embodiment of this invention, the semiconductor power device is an insulated gate bipolar transistor (IGBT).

Furthermore, this invention discloses a method of manufacturing a vertical semiconductor power device in a semiconductor substrate. The method includes a step of forming a peripheral terminal in a termination area of the semiconductor device and a central terminal disposed in an active area of the semiconductor power device for constituting a lateral diode across a lateral direction along the semiconductor substrate. A termination structure for spreading the electric field, such as floating guard rings, may be disposed between the active area and the peripheral terminal. The method may further comprise mounting the semiconductor device onto the die pad of a leadframe and connecting the peripheral terminal of the diode to a bottom terminal of the semiconductor device through the leadframe with a conductive interconnection.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2A:
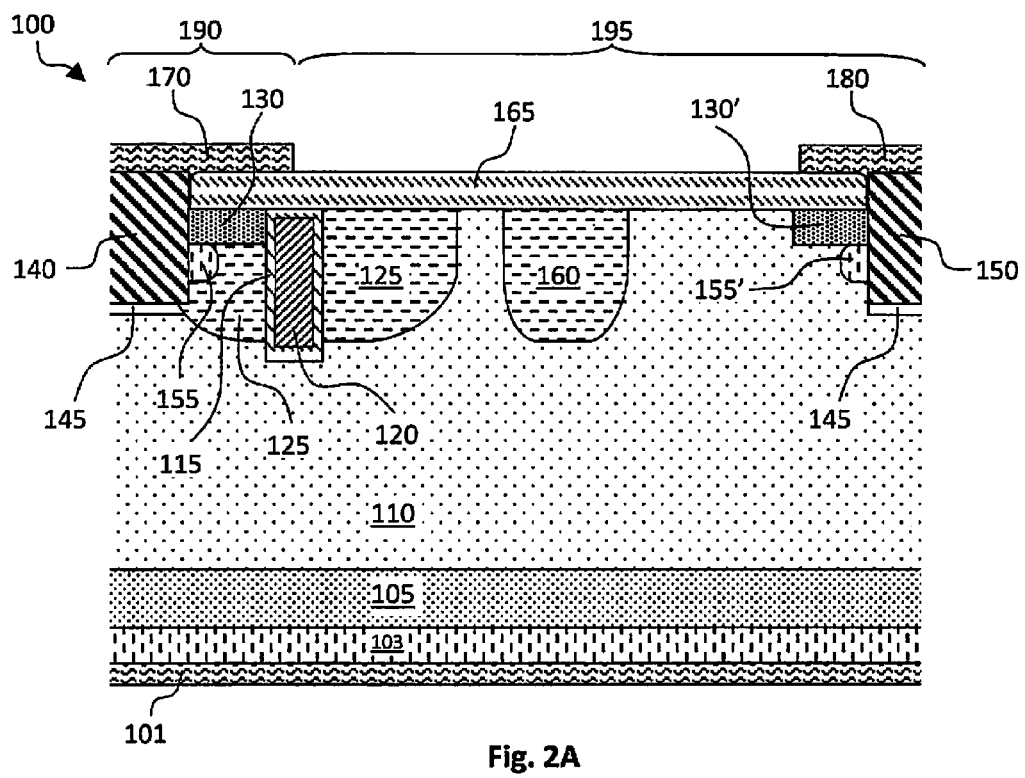
FIG. 2A is a cross sectional view of a monolithic IGBT and diode structure of this invention by combining a trench MOSFET with a lateral diode.

FIG. 2A is a cross-sectional view that shows a vertical insulated gate bipolar transistor (IGBT) integrated with a lateral diode structure of this invention as IGBT die 100. By way of example, the IGBT may include a trench metal oxide semiconductor (MOS) gate structure with a lateral diode. The combined trench MOS structure with the lateral diode is formed in a semiconductor substrate with a collector terminal 101 attached to a backside surface underneath a P-type collector layer 103 disposed at the bottom of the substrate. The substrate includes an N-type layer located over the P-type collector 103; by way of example, and as shown in FIG. 2A, this N-type layer may comprise an N-type field stop layer 105 located over the P-type collector 103, and a lightly doped N-type layer 110 (e.g. an N-type epitaxial layer) located over the N-type field stop layer 105. The N-type buffer layer 105 is more heavily doped than the N-type layer 110. The combined IGBT with a lateral diode may further include a trench gate 120 padded by a gate insulation layer 115 covering over the sidewalls and the bottom surface of a trench. The trench gate 120 is adjacent to a P-type body region 125 (i.e., emitter region) encompassing an N+ source region 130 immediately adjacent to the gate near the top surface of the epitaxial layer 110.

Figure 1A:
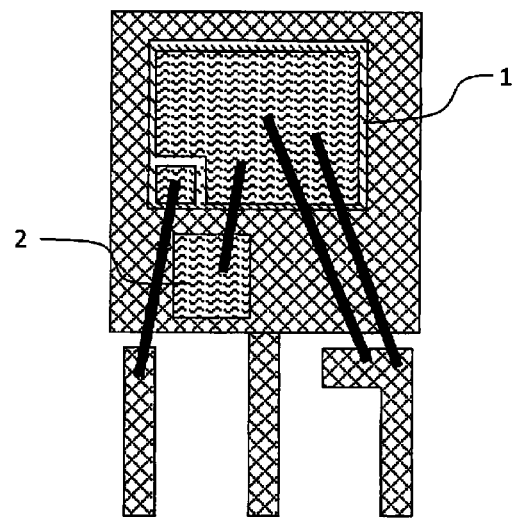
FIG. 1A is a top view showing the packaging layout of an IGBT die co-packaged with a Schottky diode die.
Figure 1B:
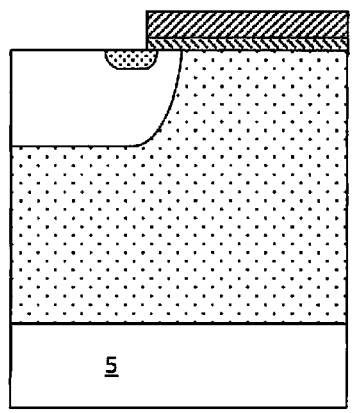
FIG. 1B is a cross sectional view of a conventional IGBT.
Figure 1C:
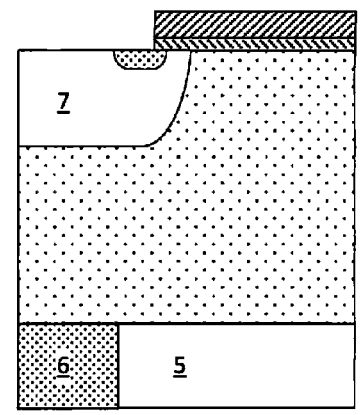
FIG. 1C is a cross sectional view of a conventional IGBT having a reverse conducting diode formed on its backside.

The IGBT die 100 further includes an active area 190 and a termination area 195. The integrated lateral diode extends laterally from the active area 190 to the termination area 195. A source/body/anode contact trench is also formed in the epitaxial layer 110 with an emitter/anode terminal 170 formed on top of a first conductive plug 140 (e.g. tungsten) with a lightly doped P-type region 145 formed immediately underneath the metal plug 140. The emitter/anode terminal 170 (through tungsten plug 140) contacts the source 130 and the body 125. The body region 125 may be supplemented by the lightly doped P-type region 145 and the heavily doped P+ body contact region 155. The lightly doped P-type region 145 forms a low injection efficiency P-N diode with the epitaxial layer 110 and N-type region 130'. The diode may be considered a P-i-N (P-type-intrinsic-N-type) diode with the P-type region 145 providing the anode of the diode, the lightly doped N-type region 110 providing the intrinsic portion of the diode and the N-type region 130' providing the cathode of the diode. A cathode terminal 180 is formed on top of a second tungsten metal plug 150 with a lightly doped P-type region 145 formed immediately underneath the metal plug 150 disposed near a peripheral of the semiconductor substrate at the outside of termination area 195. The termination area 195 further includes an optional termination structure (e.g., P-type guard ring) 160. The termination structure 160 is used to spread out the termination electric field laterally across the termination area 195 before reaching the edge of the die. The diode cathode 180 may be found outside of termination structure 160. A P+ region 155 and 155' is further formed adjacent to the tungsten plugs 140 and 150 below the source regions 130 in the active area 190 and N-type region 130' next to the tungsten plug 150 under the cathode terminal 180 respectively. By way of example, the N-type region 130' may be a channel stop region located near the periphery of the IGBT die 100. An insulation layer 165 may be extended between the emitter/anode terminal 170 and the cathode terminal 180 covering the top surface of epitaxial layer 110 between the tungsten plug 140 and tungsten plug 150. The combined lateral diode is formed as a controlled reverse-recovery (i.e., controlled reverse recovery charge (Qrr)) diode without need for conventional lifetime control measures. The diode shown in FIG. 2A is a low injection efficiency P-N junction diode formed from the lightly doped P-type region 145 under the contact trench, and the N-type epitaxial layer 110, then through the N-epitaxial layer 110 to the cathode terminal 180. Also, the heavily doped P+ body contact region 155 is small in size, also limiting the amount of carrier injection from the body region. Even if the P-N junction of the diode was formed vertically, the diode cathode terminal 180 is located in the termination area 195 laterally away from the diode anode terminal 170 in the active area 190, so the diode may be considered a lateral diode. The heavily doped N-type region 130' may be formed at the same time as the source region 130, and can provide good contact to the cathode tungsten plug 150. The heavily doped P-type region 155' may be formed at the same time as the P+ body contact region 155, and can help control the injection efficiency at the cathode end of the diode from the N+ region 130'. The size of N-type region 130' can also be designed to reduce carrier injection from N+ region 130'. This lateral diode is thus monolithically integrated with the IGBT without needing further backside processing like that required in the conventional configuration shown in FIG. 1C. The cathode terminal 180 and tungsten plug 150 may be considered a peripheral terminal of the diode, and the anode terminal 170 and tungsten plug 140 may be considered a central terminal of the lateral diode.

The device includes a vertical insulated gate bipolar transistor (IGBT) with a collector terminal 101 disposed on the bottom and an emitter/anode terminal 170 disposed on the top surface above the tungsten plug 140.

Figure 2B:
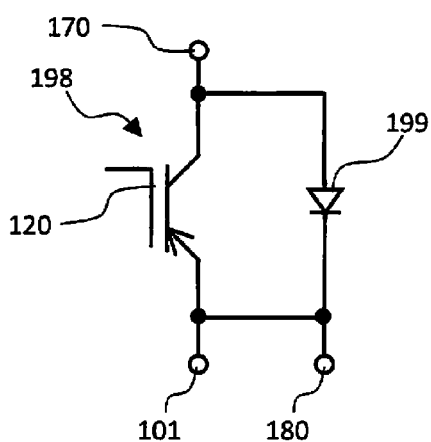
FIG. 2B is a circuit diagram showing the equivalent circuit of the IGBT device shown in FIG. 2A.

FIG. 2B is a circuit diagram that illustrates an equivalent circuit of the IGBT die 100 of FIG. 2A. An IGBT 198 is connected with an anti-parallel diode 199. Comparing FIG. 2B with FIG. 2A, the IGBT 198 is located in the active area 190 of IGBT die 100, from emitter/anode terminal 170 to collector terminal 101, and the anti-parallel diode 199 is formed from anode/emitter terminal 170 in the active area 190 to the cathode terminal 180 in the termination area 195. The cathode terminal 180 may be internally or externally connected to the collector terminal 101.

Figure 2C:
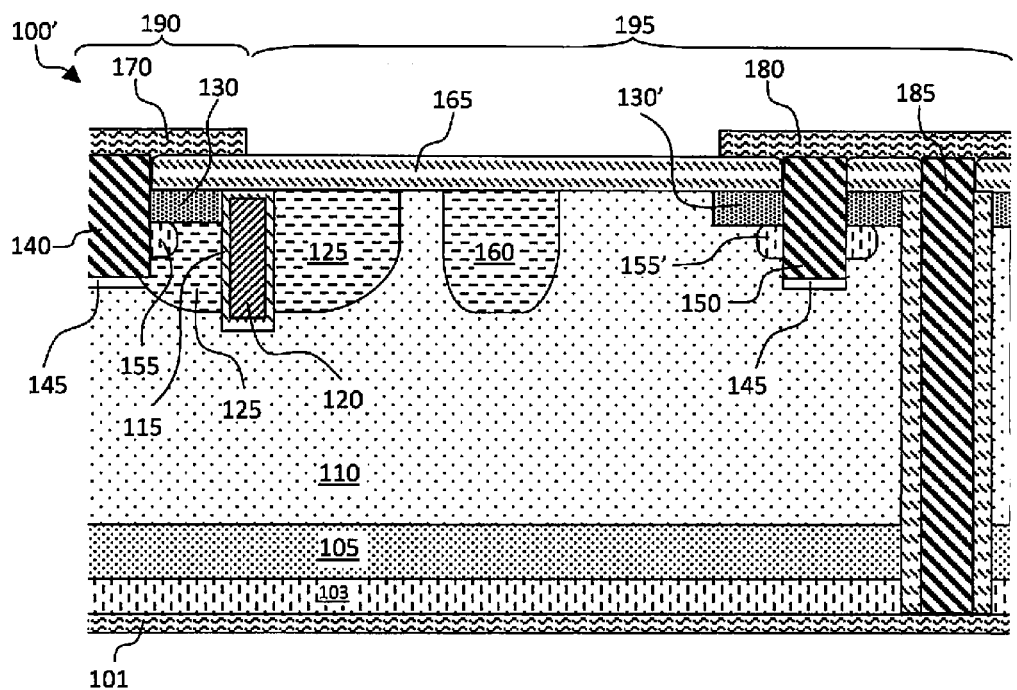
FIG. 2C is a cross sectional view of an alternative embodiment of this invention.

FIG. 2C is a cross sectional view of an IGBT die 100' similar to IGBT die 100 of FIG. 2A except that it includes a conductive through semiconductor via (TSV) 185 that internally electrically connects the cathode terminal 180 of the diode to the collector terminal 101. By way of example, the TSV 185 may include insulated sidewalls.

Figure 2D:
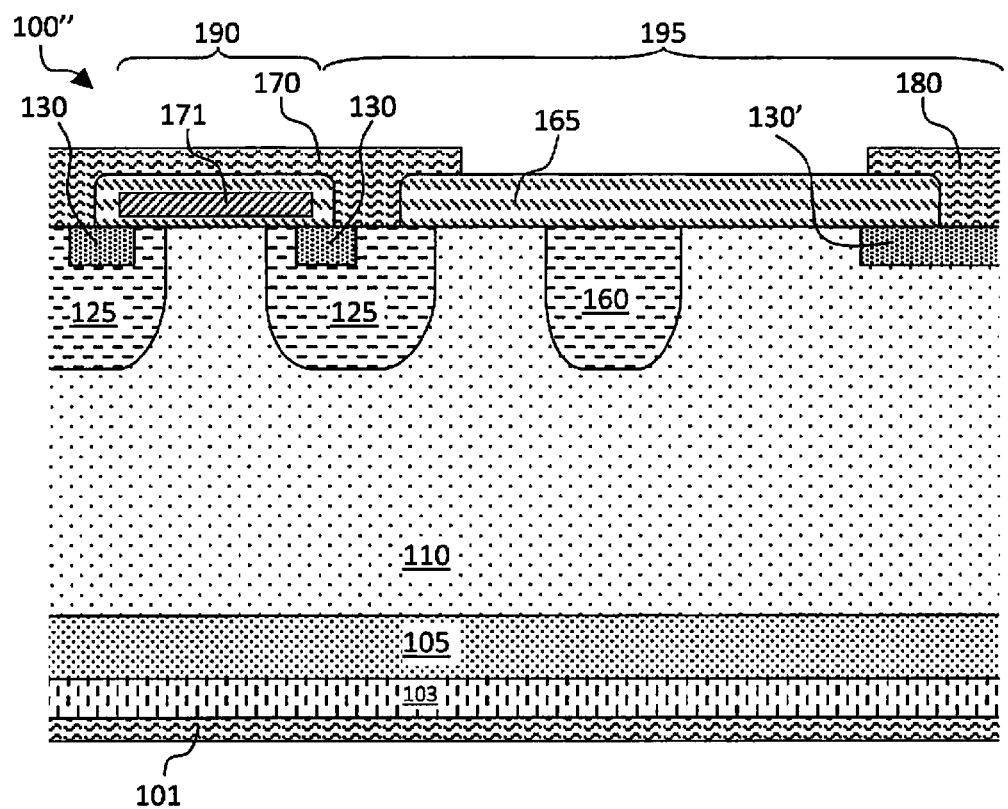
FIG. 2D is a cross sectional view of another alternative embodiment of this invention.

FIG. 2D is a cross sectional view showing an alternative embodiment of this invention. The IGBT die 100" is similar to IGBT die 100 of FIG. 2A; except that IGBT die 100" has planar gates 171 rather than trench gates 120. The integrated lateral diode may be formed from the anode/emitter electrode 170 to the P-type body region 125 into the N-type epitaxial layer 110 and laterally across into the cathode electrode 180 in the termination area 195 (e.g. at an N-type region 130').

Figure 3:
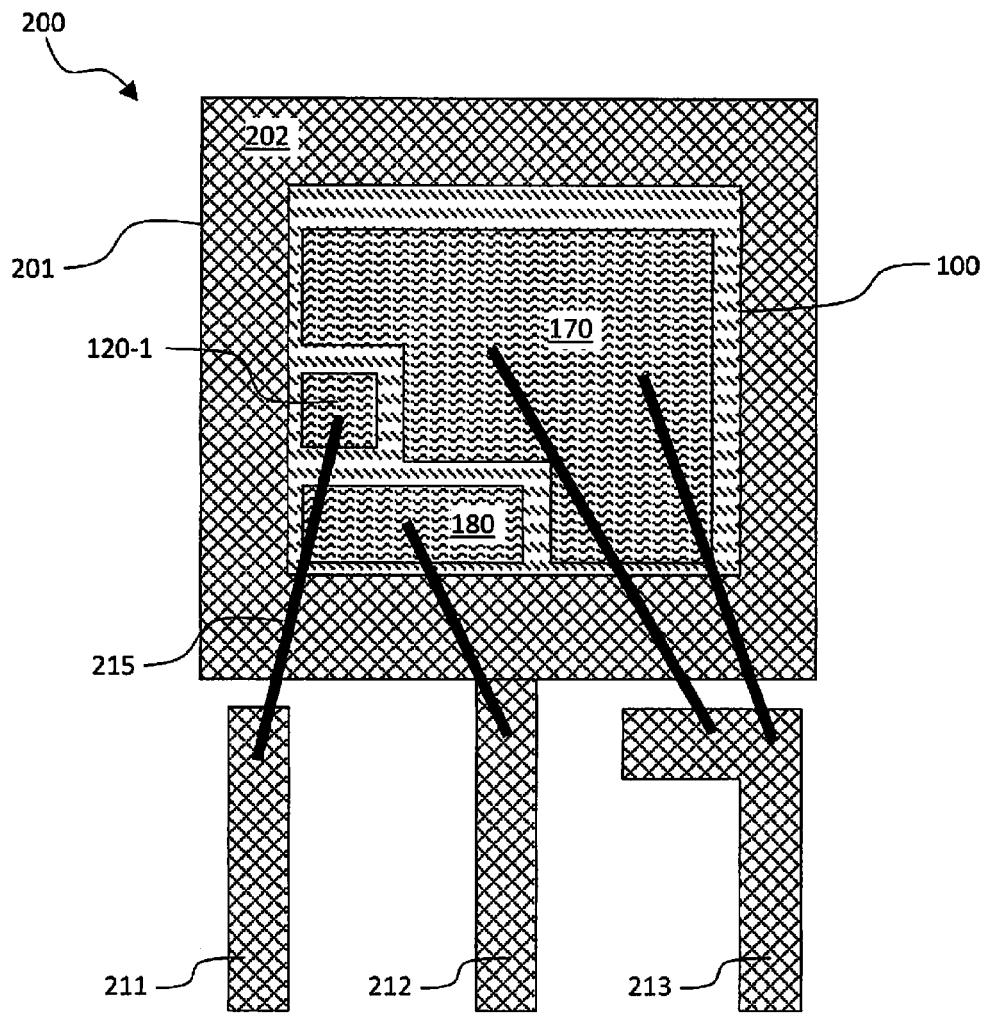
FIG. 3 is a top view for illustrating a packaging layout of the IGBT device of FIG. 2A.

FIG. 3 is a top view for illustrating the configuration for an IGBT package 200 having combined monolithic IGBT and lateral diode die 100 (like that of FIG. 2A) on a leadframe 201 with a gate lead 211 connected to a gate pad 120-1 of the IGBT die 100, a cathode/collector lead 212 connected to the cathode terminal 180 of the IGBT and integrated lateral diode die 100, and an emitter/anode lead 213 connected to the emitter/anode terminal 170 of the IGBT and integrated lateral diode die 100. By way of example, these parts may be connected by bond-wires 215, clips, or any other conductive interconnection. The cathode/collector lead 212 of the leadframe 201 is also directly connected to the collector terminal 101 (not shown in FIG. 3) at the bottom surface of the IGBT and integrated lateral diode die 100, due to the die 100 being mounted directly onto the die pad 202 of the leadframe 201 and because the cathode/collector lead is attached to die pad 202. Thus the collector terminal 101 and the cathode terminal 180 are connected together externally of die 100.

Figure 4A:
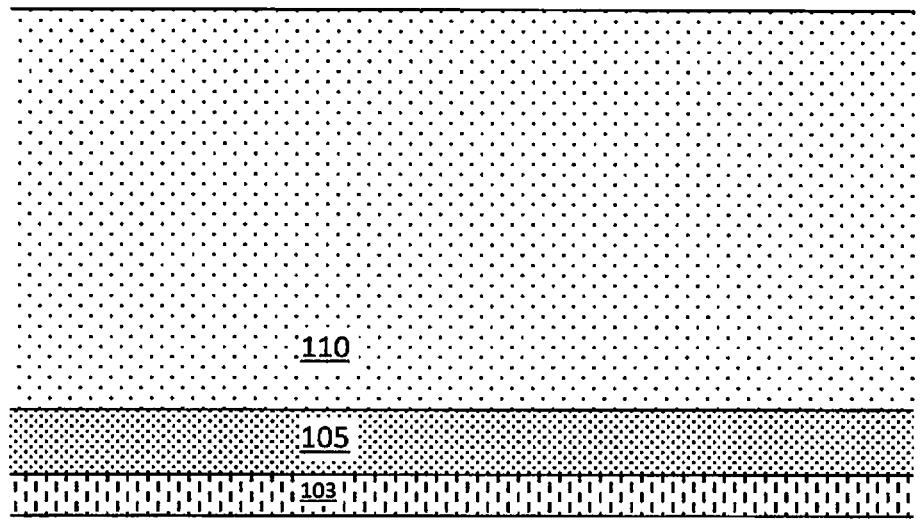
FIGS. 4A to 4F are cross sectional diagrams showing a process for making the IGBT device of FIG. 2A.
Figure 4B:
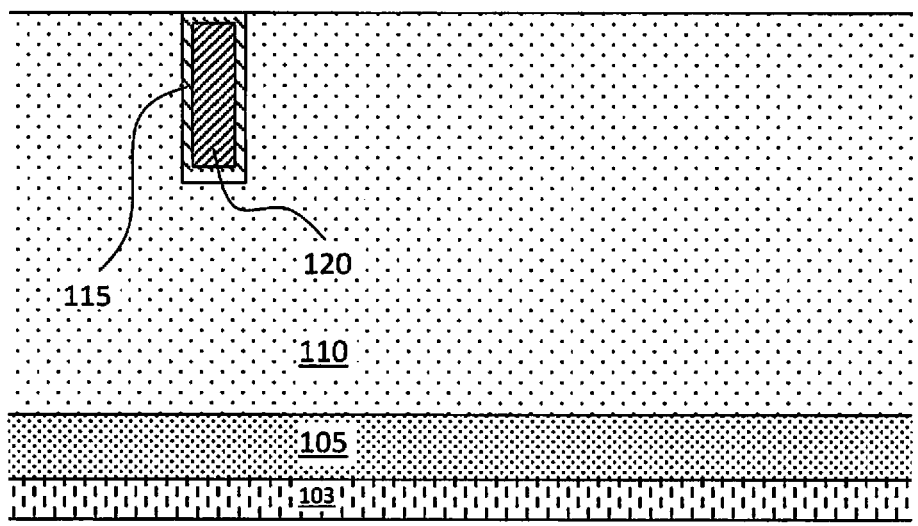
Figure 4C:
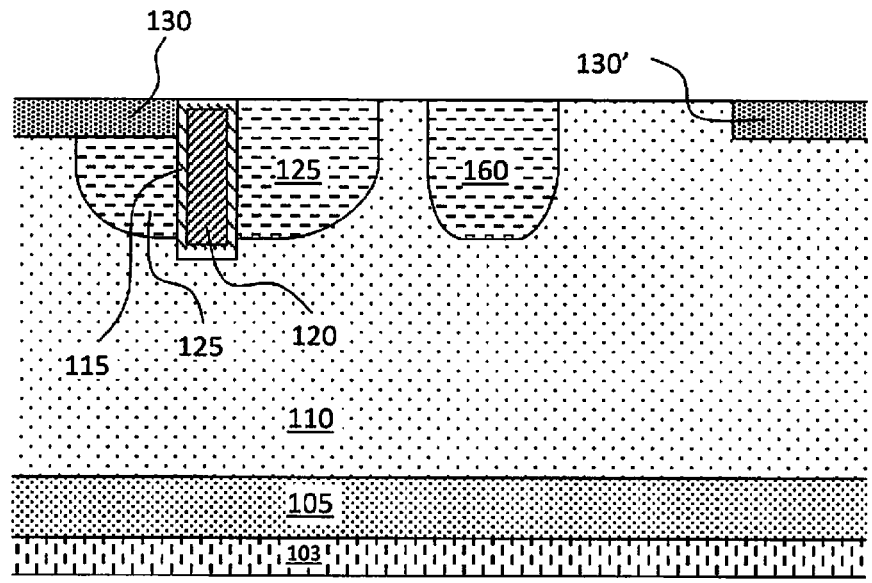
Figure 4D:
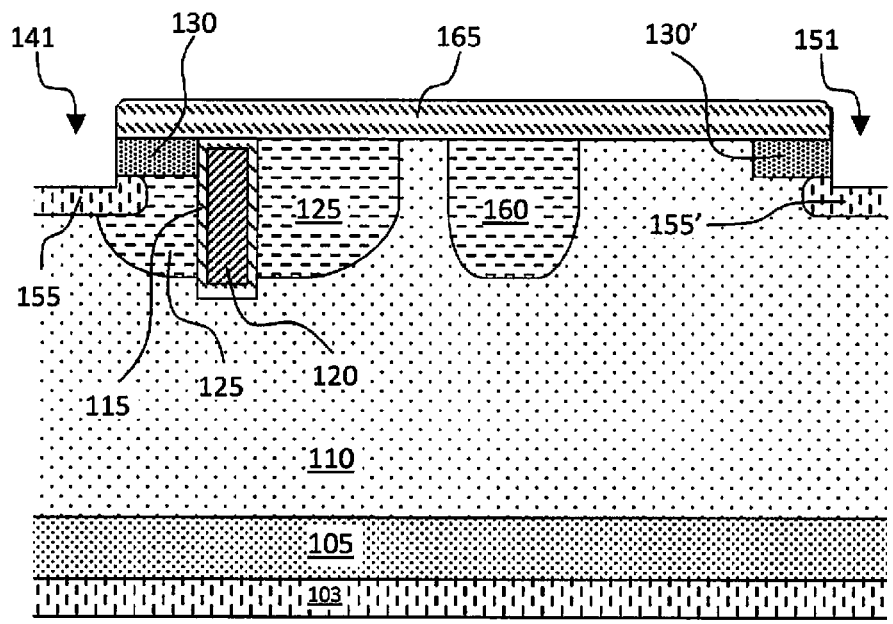
Figure 4E:
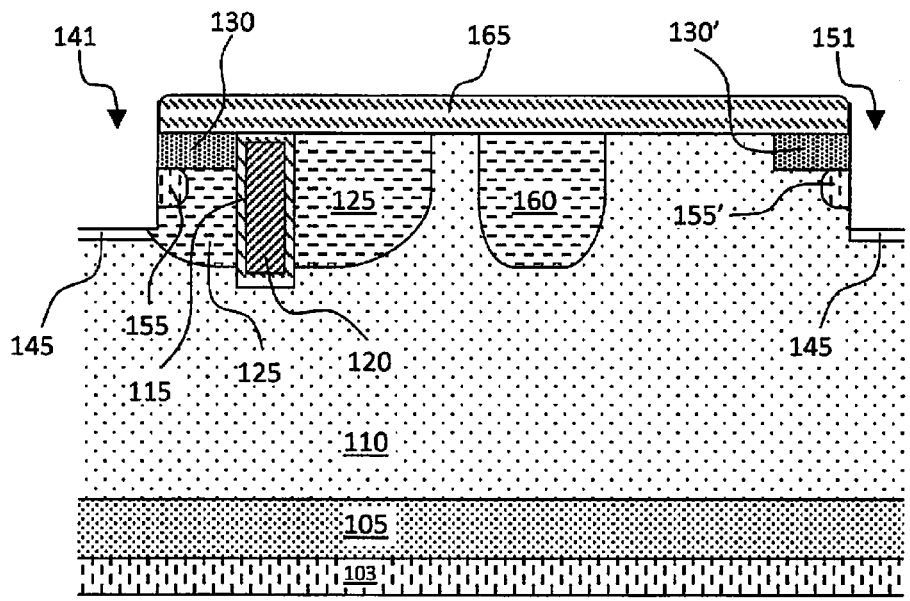
Figure 4F:
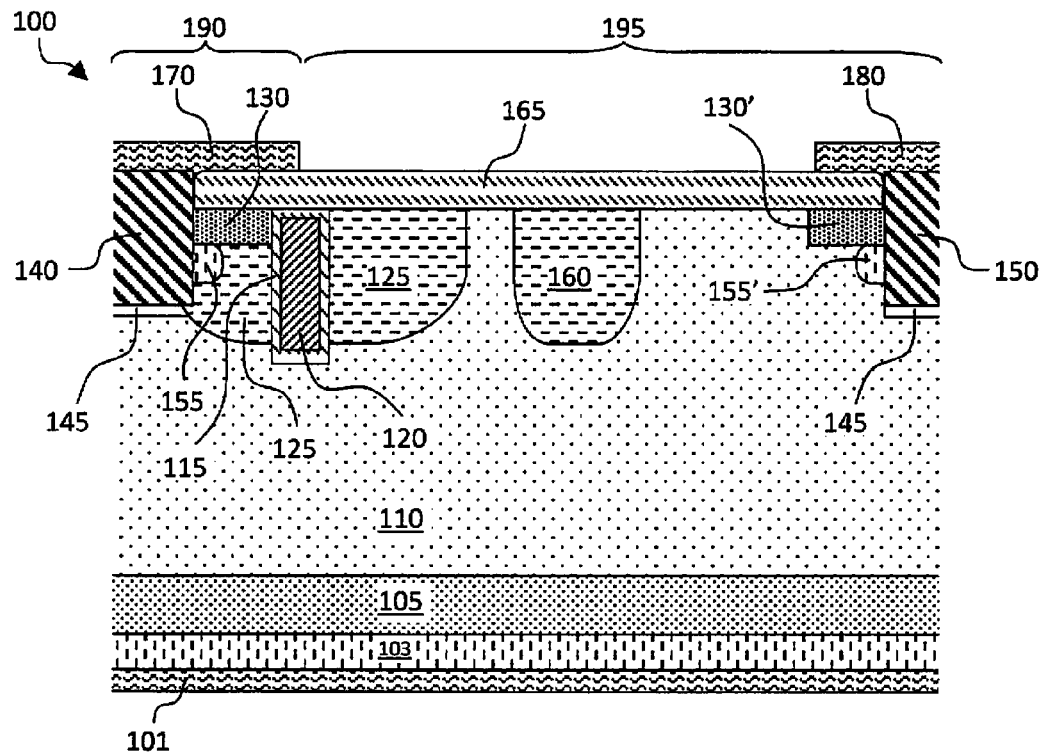

FIGS. 4A to 4F are cross sectional diagrams showing a process of making an IGBT integrated with a lateral diode semiconductor die 100 like that shown in FIG. 2A. FIG. 4A shows a P-type collector layer 103 located below an N-type buffer layer 105, and an N-type layer 110 (e.g., epitaxial layer) located over the buffer layer 105. In FIG. 4B, a gate trench structure having a gate electrode 120 and gate dielectric 115 is formed in a top portion of the N-epitaxial layer 110. Then in FIG. 4C, P-type body regions 125 (and optionally floating guard rings 160) and N-type source regions 130 and N-type region 130' are formed. By way of example, source region 130 and N-type region 130' may be formed in the same implantation steps, and the P-type body region 125 and P-type floating rings 160 may be formed in the same implantation steps. An insulating layer 165 (e.g. borophosphosilicate glass (BPSG)) is formed over the top of the die. The BPSG 165 is patterned and contact trenches 141 and 151 are partially formed into the N-epitaxial layer 110, etching into the source regions 130 and body regions 125. Heavily doped P+ body contact regions 155 and 155' may be formed (e.g. implanted and diffused) at the bottom of the partially etched contact trenches 141 and 151, as shown in FIG. 4D. Next, the partially etched contact trenches 141 and 151 may be further etched down, to vertically etch through most of the P+ body contact regions 155 and reach the lightly doped N-type epitaxial layer 110. Only a small portion of the heavily doped P+ body contact regions 155 remain at the sides of the contact trenches. At this point, a lightly doped P-type region 145 may be formed (e.g. implanted) at the bottom of contact trenches 141 and 151 to form the low injection efficiency P-N diode of the device, as shown in FIG. 4E. Conductive plugs (e.g. tungsten) 140 and 150 fill the contact trenches, and a metal layer is formed and patterned to form the emitter/anode electrode 170 and cathode electrode 180. The collector 101 is formed on the back surface of the device, contacting the collector layer 103, as shown in FIG. 4F.

Figure 5A:
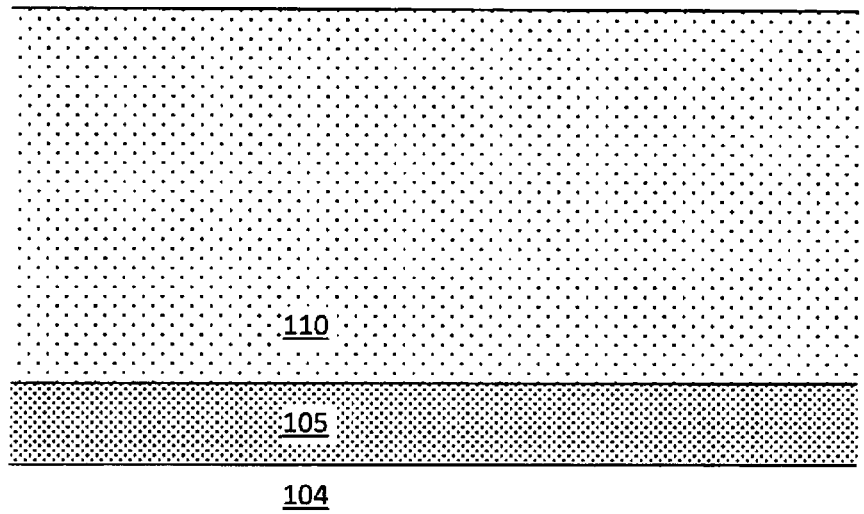
FIGS. 5A to 5D are cross sectional diagrams showing a process for making an IGBT device similar to that of FIG. 2A.
Figure 5B:
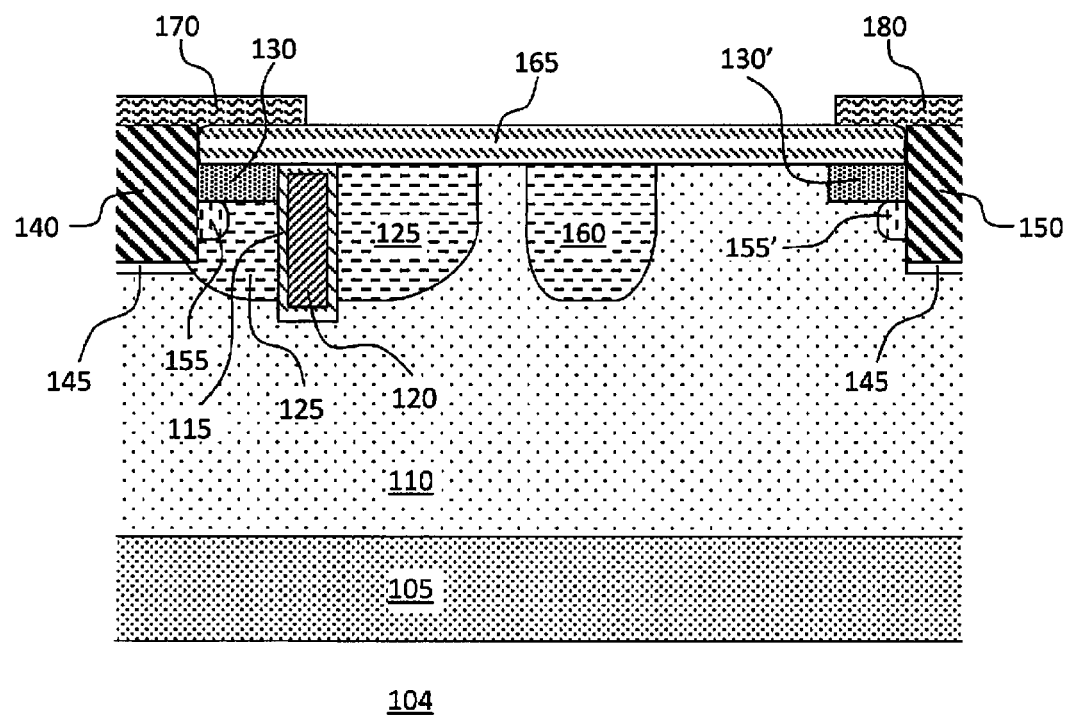
Figure 5C:
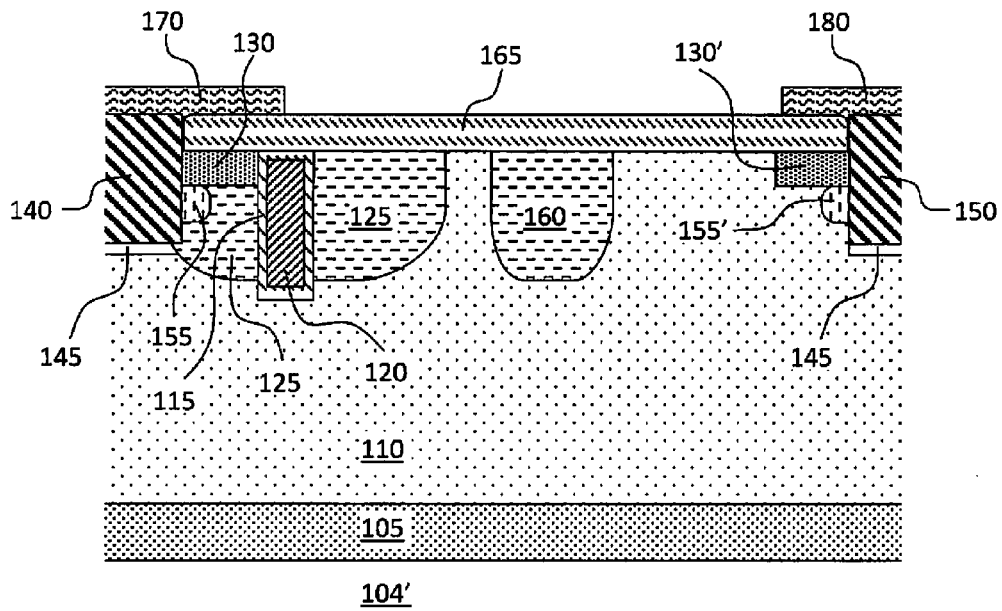
Figure 5D:
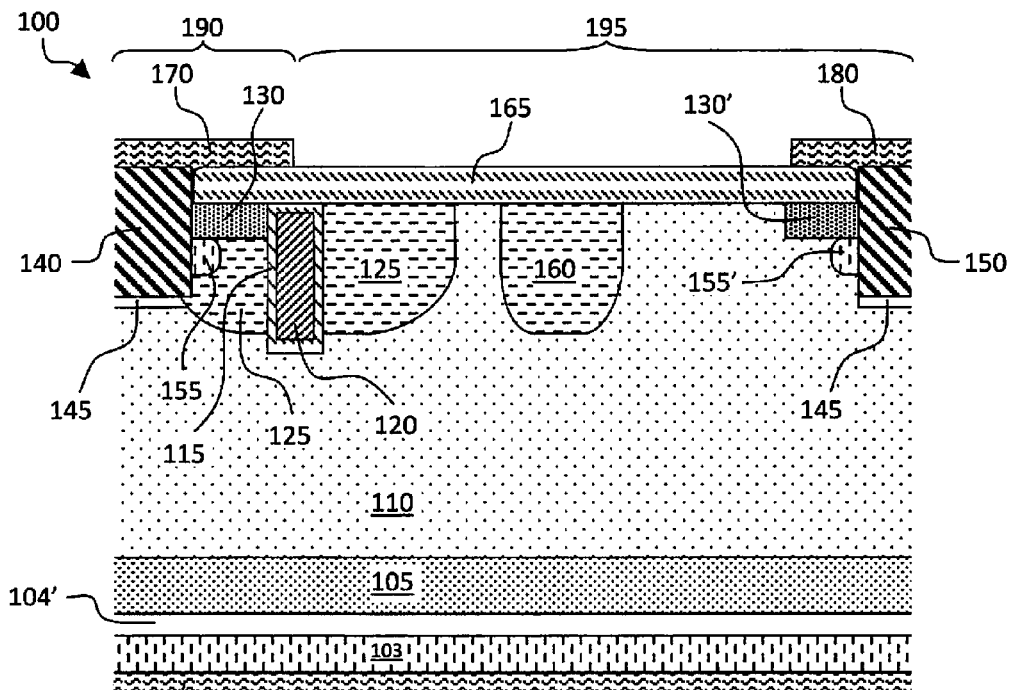

FIGS. 5A-5D are cross sectional views showing an alternative process of making IGBT die 100, starting from a different semiconductor substrate setup. In FIG. 5A, the starting semiconductor substrate is a relatively thick lightly doped layer 104 located under an N-type buffer layer 105, with a lightly doped N-type layer (e.g. epitaxial layer) 110 located over the N-type buffer layer 105. The front-side processing steps described in FIGS. 4B-4F are performed to complete the front side of the device, as shown in FIG. 5B; however, the collector terminal 101 is not yet formed on the backside. Instead, the relatively thick lightly doped layer 104 is back-grinded to form a thin lightly doped layer 104', as shown in FIG. 5C. A heavy P-type implant then forms the P-type collector layer 103 at the bottom of the device, followed by forming the collector terminal 101, as shown in FIG. 5D. Alternatively, the back-grinding and subsequent collector implant may have been performed such that no portion of the thin lightly doped layer 104' remains at the end of the process (i.e., P-type collector region 103 directly contacts the N-type buffer layer 105 without lightly doped region 104' in between).

Although the present invention has been described in terms of the presently preferred embodiment, it is to be understood that such disclosure is not to be interpreted as limiting. Various alterations and modifications will no doubt become apparent to those skilled in the art after reading the above disclosure. For example, though the text above describe an n-channel IGBT device, the invention can also be applied to P-channel devices by reversing the conductivity types of the semiconductor region (e.g. from N-type to P-type and vice-versa). Accordingly, it is intended that the appended claims be interpreted as covering all alterations and modifications as fall within the true spirit and scope of the invention.

I claim:

1. A package assembly for a vertical semiconductor device therein wherein:
    said vertical semiconductor device is formed in a semiconductor substrate having a peripheral terminal of a lateral diode in a termination area of the vertical semiconductor device and a central terminal of the diode laterally opposite from the peripheral terminal, the central terminal being disposed on an active area of the vertical semiconductor device; and
    a leadframe having conductive interconnections connected to said peripheral and central terminals of said lateral diode and said vertical semiconductor device.

2. The package assembly of claim 1 wherein:
    the semiconductor device comprises a vertical insulated gate bipolar transistor (IGBT) combined with the lateral diode disposed laterally from the active area of the IGBT and the termination area wherein said vertical IGBT includes a collector terminal disposed on a bottom surface of the semiconductor substrate and an emitter terminal disposed on a top surface of the semiconductor substrate; and
    said leadframe include a die pad for supporting the bottom surface of the semiconductor substrate and contacting the collector terminal of said vertical IGBT.

3. The package assembly of claim 2 further comprising:
    a conductive interconnection electrically connects said peripheral terminal of the diode to the collector terminal of the IGBT device through the die pad.

4. A method for forming a semiconductor device comprising:
    manufacturing a vertical semiconductor device in a semiconductor substrate and integrating a lateral diode with the vertical semiconductor device;
    forming a peripheral terminal of the diode in a termination area of the vertical semiconductor device; and
    forming a central terminal of the lateral diode in an active area of the vertical semiconductor device laterally spaced from the central terminal.

5. The method of claim 4 wherein:
    the step of manufacturing said semiconductor device is a step of manufacturing a vertical insulated gate bipolar transistor (IGBT) wherein the lateral diode is disposed laterally from the active area of the IGBT to the termination area of the IGBT with a collector terminal of said vertical IGBT formed on a bottom surface of the semiconductor substrate and an emitter terminal formed on a top surface of the semiconductor substrate.

6. The method of claim 5 further comprising:

mounting said vertical IGBT onto a die pad of a leadframe, said die pad electrically contacting the collector terminal of said vertical IGBT.

7. The method of claim 6 further comprising:

connecting a conductive interconnection from the peripheral terminal of the lateral diode to leadframe, thereby electrically connecting the peripheral terminal of the lateral diode to the collector terminal of the IGBT through the die pad.

* * * * *